United States Patent
Derderian

(10) Patent No.: US 6,569,709 B2
(45) Date of Patent: May 27, 2003

(54) ASSEMBLIES INCLUDING STACKED SEMICONDUCTOR DEVICES SEPARATED A DISTANCE DEFINED BY ADHESIVE MATERIAL INTERPOSED THEREBETWEEN, PACKAGES INCLUDING THE ASSEMBLIES, AND METHODS

(75) Inventor: James M. Derderian, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/977,456

(22) Filed: Oct. 15, 2001

(65) Prior Publication Data

US 2003/0071340 A1 Apr. 17, 2003

(51) Int. Cl.⁷ ................................................ H01L 21/44
(52) U.S. Cl. ........................ 438/109; 438/118; 257/777; 257/686; 257/784
(58) Field of Search ................................ 438/109, 118; 257/777, 686, 784

(56) References Cited

U.S. PATENT DOCUMENTS

| | | | |
|---|---|---|---|
| 5,323,060 A | 6/1994 | Fogal et al. | |
| 5,801,439 A * | 9/1998 | Fujisawa et al. | 257/686 |
| 5,985,695 A * | 11/1999 | Freyman et al. | 257/668 |
| RE36,613 E | 3/2000 | Ball | |
| 6,051,886 A | 4/2000 | Fogal et al. | |
| 6,212,767 B1 | 4/2001 | Tandy | |
| 6,333,562 B1 * | 12/2001 | Lin | 257/777 |
| 6,340,846 B1 * | 1/2002 | LoBianco et al. | 257/686 |
| 6,388,313 B1 * | 5/2002 | Lee et al. | 257/686 |
| 6,414,384 B1 | 7/2002 | Lo et al. | |

* cited by examiner

Primary Examiner—David L. Talbott
Assistant Examiner—Luan Thai
(74) Attorney, Agent, or Firm—TraskBritt

(57) ABSTRACT

A method for assembling semiconductor devices includes providing a first semiconductor device, applying a volume of adhesive material to at least a surface of the first semiconductor device, and positioning a second semiconductor device over the first semiconductor device and a portion of at least one discrete conductive element protruding thereabove. The adhesive material may be applied to a surface of the first semiconductor device prior to positioning the second semiconductor device thereover, or introduced between the first and second semiconductor devices. Upon curing, the predetermined volume of adhesive material spaces the first and second semiconductor devices a predetermined distance apart from one another. Additional semiconductor devices may also be added to the assembly. The first semiconductor device may be associated with a substrate. Semiconductor device assemblies and packages that are at least partially fabricated in accordance with the method are also disclosed.

31 Claims, 3 Drawing Sheets

ASSEMBLIES INCLUDING STACKED SEMICONDUCTOR DEVICES SEPARATED A DISTANCE DEFINED BY ADHESIVE MATERIAL INTERPOSED THEREBETWEEN, PACKAGES INCLUDING THE ASSEMBLIES, AND METHODS

BACKGROUND OF THE INVENTION

1. Field of the Invention

The present invention relates generally to semiconductor device assemblies, or so-called "multi-chip modules", and, more specifically, to multi-chip modules in which two or more semiconductor devices are stacked relative to one another. In particular, the present invention relates to stacked semiconductor device assemblies in which the upper semiconductor device of an adjacent pair of semiconductor devices at least partially overlies discrete conductive elements protruding above the lower semiconductor device of the adjacent pair and the distances between adjacent, stacked semiconductor devices are determined, at least in part, by a quantity of adhesive material interposed therebetween.

2. Background of Related Art

In order to conserve the amount of surface area, or "real estate", consumed on a carrier substrate, such as a circuit board, by semiconductor devices connected thereto, various types of increased density packages have been developed. Among these various types of packages is the so-called "multi-chip module" (MCM). Some types of multi-chip modules include assemblies of semiconductor devices that are stacked one on top of another. The amount of surface area on a carrier substrate that may be saved by stacking semiconductor devices is readily apparent-a stack of semiconductor devices consumes roughly the same amount of real estate on a carrier substrate as a single, horizontally oriented semiconductor device or semiconductor device package.

Due to the disparity in processes that are used to form different types of semiconductor devices (e.g., the number and order of various process steps), the incorporation of different types of functionality into a single semiconductor device has proven very difficult to actually reduce to practice. Even in cases where semiconductor devices that carry out multiple functions can be fabricated, multi-chip modules that include semiconductor devices with differing functions (e.g., memory, processing capabilities, etc.) are often much more desirable since the separate semiconductor devices may be fabricated independently and later assembled with one another much more quickly and cost-effectively (e.g., lower production costs due to higher volumes and lower failure rates).

Multi-chip modules may also contain a number of semiconductor devices that perform the same function, effectively combining the functionality of all of the semiconductor devices thereof into a single package.

An example of a conventional, stacked multi-chip module includes a carrier substrate, a first, larger semiconductor device secured to the carrier substrate, and a second, smaller semiconductor device positioned over and secured to the first semiconductor device. The second semiconductor device does not overlie bond pads of the first semiconductor device and, thus, the second semiconductor device does not cover bond wires that electrically connect bond pads of the first semiconductor device to corresponding contacts or terminals of the carrier substrate. As the bond pads of each lower semiconductor device are not covered by the next higher semiconductor device, vertical spacing between the semiconductor devices is not important. Thus, any suitable adhesive may be used to secure the semiconductor devices to one another. Such a multi-chip module is disclosed and illustrated in U.S. Pat. No. 6,212,767, issued to Tandy on Apr. 10, 2001 (hereinafter "the '767 Patent"). As the sizes of the semiconductor devices of such a multi-chip module must continue to decrease as they are positioned increasingly higher on the stack, the obtainable heights of such multi-chip modules become severely limited.

Another example of a conventional multi-chip module is described in U.S. Pat. No. 5,323,060, issued to Fogal et al. on Jun. 21, 1994 (hereinafter "the '060 Patent"). The multi-chip module of the '060 Patent includes a carrier substrate with semiconductor devices disposed thereon in a stacked arrangement. The individual semiconductor devices of each multi-chip module may be the same size or different sizes, with upper semiconductor devices being either smaller or larger than underlying semiconductor devices. Adjacent semiconductor devices of each of the multi-chip modules disclosed in the '060 Patent are secured to one another with an adhesive layer. The thickness of each adhesive layer well exceeds the loop heights of wire bonds protruding from a semiconductor device upon which that adhesive layer is to be positioned. Accordingly, the presence of each adhesive layer prevents the back side of an overlying, upper semiconductor device from contacting bond wires that protrude from an immediately underlying, lower semiconductor device of the multi-chip module. The adhesive layers of the multi-chip modules disclosed in the '060 Patent do not encapsulate or otherwise cover any portion of the bond wires that protrude from any of the lower semiconductor devices. It does not appear that the inventors named on the '060 Patent were concerned with overall stack heights. Thus, the multi-chip modules of the '060 Patent may be undesirably thick due to the use of thick spacers or adhesive structures between each adjacent pair of semiconductor devices, resulting in wasted adhesive and excessive stack height.

A similar but more compact multi-chip module is disclosed in U.S. Pat. Re. 36,613, issued to Ball on Mar. 14, 2000 (hereinafter "the '613 Patent"). The multi-chip module of the '613 Patent includes many of the same features as those disclosed in the '060 Patent, including adhesive layers of carefully controlled thicknesses that space vertically adjacent semiconductor devices apart a greater distance than the loop heights of wire bonds protruding from the lower of the adjacent dice. The use of thinner bond wires with low-loop profile wire bonding techniques permits adjacent semiconductor devices of the multi-chip module disclosed in the '060 Patent to be positioned more closely to one another than adjacent semiconductor devices of the multi-chip modules disclosed in the '060 Patent. Nonetheless, an undesirably large amount of additional space may remain between the tops of the bond wires protruding from one semiconductor device and the back side of the next higher semiconductor device of such a stacked multi-chip module.

Conventionally, when a particular amount of spacing is needed between semiconductor devices to separate discrete conductive elements, such as bond wires, that protrude above an active surface of one semiconductor device from the back side of the next higher semiconductor device, the semiconductor devices of stacked multi-chip modules have been separated from one another with spacers. Exemplary spacers that have been used in stacked semiconductor device arrangements have been formed from dielectric-coated silicon or a polyimide film. An adhesive material typically secures such a spacer between adjacent semiconductor devices. The use of such preformed spacers is somewhat undesirable since an additional alignment and assembly step is required for each such spacer. Proper alignment of a preformed spacer with a semiconductor device requires that the spacer not be positioned over bond pads of the semiconductor device. In addition, if a preformed spacer is placed on the surface of a semiconductor device that has already been electrically connected to a substrate, the spacer must be positioned in such a manner that the often delicate discrete conductive elements, such as bond wires, extending from the bond pads of the semiconductor device not be damaged. As those of skill in the art are aware, improper alignment and placement of such a preformed spacer may increase the likelihood that a semiconductor device may be damaged, thereby decreasing overall product yields.

The vertical distance that adjacent semiconductor devices of a stacked type multi-chip module are spaced apart from one another may be reduced by arranging the immediately underlying semiconductor devices such that upper semiconductor devices are not positioned over bond pads of immediately lower semiconductor devices or bond wires protruding therefrom. Thus, adjacent semiconductor devices may be spaced apart from one another a distance that is about the same as or less than the loop heights of the wire bonds that protrude above the active surface of the lower semiconductor device. U.S. Pat. No. 6,051,886, issued to Fogal et al. on Apr. 18, 2000 (hereinafter "the '886 Patent"), discloses such a multi-chip module. According to the '886 Patent, wire bonding is not conducted until all of the semiconductor devices of such a multi-chip module have been assembled with one another and with the underlying carrier substrate. The semiconductor devices of the multi-chip modules disclosed in the '886 Patent must have bond pads that are arranged on opposite peripheral edges. Semiconductor devices with bond pads positioned adjacent the entire peripheries thereof could not be used in the multi-chip modules of the '886 Patent. This is a particularly undesirable limitation due to the ever-increasing feature density of state-of-the-art semiconductor devices, which is often accompanied by a subsequent need for an ever-increasing number of bond pads on semiconductor devices.

In view of the foregoing, it appears that a method for forming stacked semiconductor device assemblies which reduces the likelihood of damage to semiconductor devices and associated wire bonds, as well as provides flexibility in bond pad number and placement, would be useful.

SUMMARY OF THE INVENTION

The present invention includes semiconductor device assemblies, as well as a method for assembling semiconductor devices in a stacked arrangement.

A semiconductor device assembly incorporating teachings of the present invention includes a first semiconductor device with discrete conductive elements protruding over at least a portion of an active surface thereof, adhesive material over the active surface, and a second semiconductor device positioned at least partially over the first semiconductor device, as well as at least partially over at least some discrete conductive elements protruding above the active surface of the first semiconductor device. The adhesive material is dispensed or applied in an amount substantially equal to a predetermined volume that spaces the first and second semiconductor devices apart from one another by a distance substantially the same as a predetermined distance that maintains electrical isolation between the discrete conductive elements protruding over the active surface of the first semiconductor device and the back side of the second semiconductor device while minimizing the height of the assembly.

The semiconductor device assembly may also include a substrate, such as a circuit board, an interposer, another semiconductor device, or leads, that includes contact areas to which bond pads of at least the first semiconductor device are electrically connected.

The discrete conductive elements that protrude above the active surface of the first semiconductor device may be electrically connected to corresponding contact areas of a substrate, such as a circuit board, an interposer, another semiconductor device, or leads. Alternatively, the discrete conductive elements may themselves comprise leads (e.g., in a leads-over-chip (LOC) type arrangement with the first semiconductor device).

Portions of the semiconductor device assembly may be encapsulated. For example, the first and second semiconductor devices, as well as portions of a substrate, if any, that are located adjacent to the first semiconductor device and discrete conductive elements extending between those portions of a substrate and the first and second semiconductor devices, may be partially or fully covered with an encapsulant.

A first exemplary embodiment of a method for forming an assembly according to the present invention includes providing a first semiconductor device with discrete conductive elements protruding at least partially over an active surface thereof, placing an amount substantially equal to a predetermined volume of at least partially unconsolidated adhesive material on the active surface, and positioning a second semiconductor device over the adhesive material. Alternatively, the adhesive material may be applied to a back side of the second semiconductor device before placing the second semiconductor device over the first semiconductor device.

Various types of adhesive materials, including, without limitation, epoxies, silicones, silicone-carbon resins, polyimides, and polyurethanes, may be used.

The volume of the adhesive material is selected to space the first and second semiconductor devices a distance substantially the same as a predetermined distance apart from one another. Various criteria, which may include one or more of the viscosity of the adhesive material, surface tension of the adhesive material, shrinkage or expansion of the adhesive material upon curing, the surface area to which the adhesive material is applied, the weight of the second semiconductor device, and the force applied to the second semiconductor device upon positioning thereof, may factor into the predetermined distance that may be achieved with a particular volume of a specific type of adhesive material. The adhesive material preferably has a viscosity and/or surface tension that will prevent the adhesive material from flowing off of the active surface of the first semiconductor device and enable the adhesive material to support the second semiconductor device positioned thereon while maintaining electrical isolation between the back side of the second semiconductor device and the discrete conductive elements that protrude over the active surface of the first semiconductor device.

When the first and second semiconductor devices are spaced apart substantially a set distance from one another, which set distance may differ from the predetermined distance if an adhesive material is employed that expands or shrinks upon curing, the adhesive material may be cured to at least a semisolid state.

In a second exemplary embodiment of assembly method incorporating teachings of the present invention, a first semiconductor device is provided that includes discrete conductive elements protruding above an active surface thereof, a second semiconductor device is positioned at least partially over the first semiconductor device, and a predetermined quantity of adhesive material is introduced between the first and second semiconductor devices. The second semiconductor device may be at least temporarily secured to the first semiconductor device by way of a small quantity of adhesive material, such as an adhesive polymer, solder flux, or the like, which may, for example, be placed on a surface of the first semiconductor device, the second semiconductor device, and/or one or more discrete conductive elements prior to positioning the second semiconductor device over the first semiconductor device. In positioning the second semiconductor device at least partially over the first semiconductor device, the back side of the second semiconductor device may rest upon portions of the discrete conductive elements that protrude above the active surface of the first semiconductor device.

The discrete conductive elements that protrude above the active surface of the first semiconductor device may be electrically connected to corresponding contact areas of a substrate, such as a circuit board, an interposer, another semiconductor device, or leads. Alternatively, the discrete conductive elements may themselves comprise leads (e.g., in a leads-over-chip (LOC) type arrangement with the first semiconductor device).

The amount of adhesive material that is introduced between the first and second semiconductor devices spaces the first and second semiconductor devices a distance substantially the same as a predetermined distance apart from one another. Various criteria, such as the viscosity of the adhesive material, the surface tension of the adhesive material, shrinkage or expansion of the adhesive material upon curing, the surface area to which the adhesive material is applied, the weight of the second semiconductor device, the force applied to the second semiconductor die upon placement thereof, or discrete conductive elements positioned between the first and second semiconductor dice, may factor into the predetermined distance that may be achieved with a particular volume of a specific type of adhesive material.

The adhesive material preferably has a viscosity that facilitates introduction thereof between the first and second semiconductor devices and, possibly, around portions of discrete conductive elements between the first and second semiconductor devices without resulting in the formation of voids therein. The wetting properties of an adhesive material may facilitate spreading thereof over the active surface of the first semiconductor device and the back side of the second semiconductor device, as well as capillary action, or "wicking" through the spaces between the first and second semiconductor devices and around the portions of discrete conductive elements located between the first and second semiconductor devices. Spreading of the adhesive material may be aided by application of heat thereto or by mechanical vibration of the assembly. When a fixed quantity of adhesive material that is smaller than the volume between the first and second semiconductor devices is used, the surface tension of the adhesive material may cause the distance between the first and second semiconductor devices to decrease as the adhesive material spreads therebetween, thereby decreasing the overall height of the assembly substantially to the predetermined distance therebetween.

Upon being introduced between the first and second semiconductor devices, the predetermined volume of adhesive material may lift the back side of the second semiconductor device off of the discrete conductive elements or may coat portions of the discrete conductive elements that are located adjacent to the back side of the second semiconductor device, or a combination thereof may be used to electrically isolate the back side of the second semiconductor device from underlying discrete conductive elements. The distance the first and second semiconductor devices are spaced apart once the predetermined volume of adhesive material has been introduced therebetween may or may not be the same as the predetermined distance, depending upon whether the adhesive material shrinks or expands upon curing.

In the event that the predetermined quantity of adhesive will cause the back side of the second semiconductor device to come to rest upon discrete conductive elements protruding above the active surface of the first semiconductor device, it is preferred that the back side of the second semiconductor device and the discrete conductive elements be electrically isolated from one another, for example, by way of a dielectric (e.g., adhesive material, dielectric oxide, etc.) coating on at least portions of the back side of the second semiconductor device that contact discrete conductive elements, a dielectric coating on at least portions of the discrete conductive elements that contact the back side, or some combination thereof.

When the adhesive material is cured, the first and second semiconductor devices are spaced apart from one another a distance that is substantially the same as the predetermined distance. Once the adhesive material cures, it may provide some physical support to the second semiconductor device. Bond pads of the second semiconductor device may then be electrically connected to one or both of corresponding contact areas of the substrate and corresponding bond pads of the first semiconductor device.

Of course, assemblies incorporating teachings of the present invention may include more than two semiconductor devices in stacked arrangement.

Once the semiconductor devices of such an assembly have been assembled with one another and electrically connected with a substrate or with one another, the assembly may be packaged, as known in the art.

Other features and advantages of the present invention will become apparent to those of ordinary skill in the art through consideration of the ensuing description, the accompanying drawings, and the appended claims.

BRIEF DESCRIPTION OF THE DRAWINGS

In the drawings, which illustrate exemplary embodiments of various aspects of the present invention.

DETAILED DESCRIPTION

Figure 1:
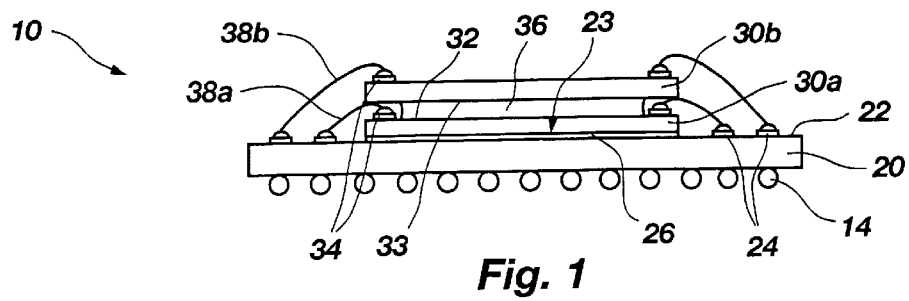
FIG. 1 is a schematic representation of one embodiment of an assembly incorporating teachings of the present invention.

With reference to FIG. 1, an exemplary embodiment of an assembly 10 incorporating teachings of the present invention is illustrated. As shown, assembly 10 includes a substrate 20 with two semiconductor devices 30a, 30b (collectively referred to as "semiconductor devices 30") positioned thereover in stacked arrangement.

The depicted substrate 20 is an interposer with a number of bond pads, which are referred to herein as contact areas 24, through which electrical signals are input to or output from semiconductor devices 30 carried upon or adjacent to a surface 22 of substrate 20. Each contact area 24 corresponds to a bond pad 34 on an active surface 32 of one of the semiconductor devices 30 positioned upon substrate 20.

Of course, the use of other types of substrates, such as circuit boards, semiconductor devices, leads, and the like, in assemblies and assembly methods incorporating teachings of the present invention is also within the scope of the present invention. Accordingly, a substrate 20 may be formed from silicon, glass, ceramic, an organic material (e.g., FR-4 resin), metal (e.g., copper, aluminum, etc.), or any other suitable material. Contact areas 24, shown in the form of bond pads, are arranged on surface 22 of substrate 20 adjacent to a semiconductor device supporting region 23 of surface 22.

A first semiconductor device 30a is secured to substrate 20 by way of a first adhesive element 26, such as a quantity of an appropriate thermoset resin, a quantity of pressure sensitive adhesive, an adhesive-coated film or tape, or the like. Bond pads 34 of first semiconductor device 30a communicate with corresponding contact areas 24 of substrate 20 by way of discrete conductive elements 38a, such as the illustrated bond wires, tape-automated bond (TAB) elements comprising traces carried on a flexible dielectric film, other thermocompression bonded leads, and other known types of conductive elements.

Second semiconductor device 30b is positioned over, or "stacked" on, first semiconductor device 30a. A back side 33 of second semiconductor device 30b is electrically isolated from discrete conductive elements 38a either by being spaced apart therefrom as shown in FIG. 1 or by way of dielectric coatings on at least portions of discrete conductive elements 38a that may contact back side 33. Alternatively, back side 33 may include dielectric coatings on at least portions thereof that contact discrete conductive elements 38a. Second semiconductor device 30b is secured to first semiconductor device 30a by way of a second adhesive element 36 interposed between and secured to active surface 32 of first semiconductor device 30a and back side 33 of second semiconductor device 30b. By way of example only, second adhesive element 36 may comprise a thermoplastic resin, a thermoset resin, an epoxy, or any other suitable material that, upon at least partial curing, will adhere to and substantially maintain the desired relative positions of first and second semiconductor devices 30a, 30b.

Bond pads 34 of second semiconductor device 30b may be electrically connected to corresponding contact areas 24 of substrate 20 by way of discrete conductive elements 38b. Discrete conductive elements 38b may comprise the aforementioned bond wires, TAB elements, other thermocompression bonded leads, or any other known type of discrete conductive element for extending between and establishing the desired communication between a bond pad 34 and its corresponding contact area 24.

Assembly 10 may also include a plurality of external connective elements 14 carried by substrate 20 and in electrical communication with contact areas 24 through vias and traces of substrate 20, such as the depicted solder balls, conductive pins, or any other conductive structures that are suitable for interconnecting assembly 10 with other, external electronic components.

Turning now to FIGS. 2–8, an exemplary method for fabricating assembly 10 is illustrated.

Figure 2:
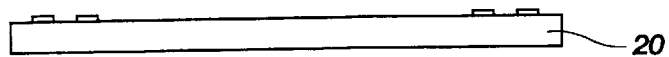
FIGS. 2–6 are schematic representations depicting fabrication of the assembly depicted in FIG. 1.

In FIG. 2, a substrate 20, in this case an interposer, is provided.

Figure 3:
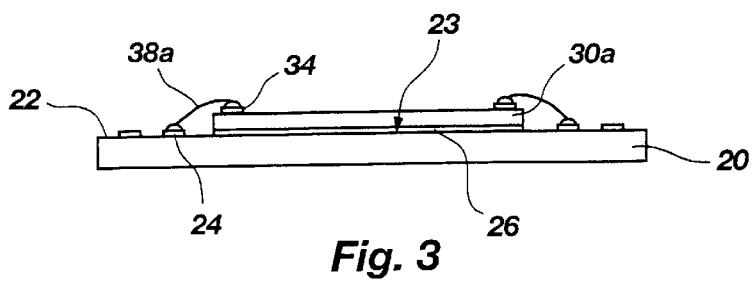

Next, as shown in FIG. 3, first semiconductor device 30a is positioned on and secured to supporting region 23 of surface 22 by way of first adhesive element 26. By way of example, first adhesive element 26 may comprise an adhesive-coated structure, such as a polyimide film, or a quantity of adhesive material (e.g., thermoset resin, thermoplastic resin, epoxy, etc.). Discrete conductive elements 38a, depicted as bond wires, are formed or placed between bond pads 34 of first semiconductor device 30a and their corresponding contact areas 24 of substrate 20.

Figure 4:
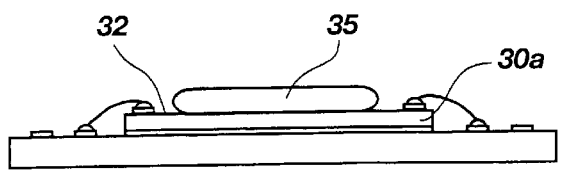

FIG. 4 illustrates the application of a volume that is substantially equal to a predetermined volume of at least partially unconsolidated (e.g., liquid, gel, etc.) adhesive material 35 on active surface 32 of first semiconductor device 30a. Upon curing, the predetermined quantity of adhesive material 35 will cause a subsequently positioned second semiconductor device 30b (FIG. 5) to be spaced a distance substantially the same as a predetermined distance apart from first semiconductor device 30a.

Adhesive material 35 preferably has sufficient viscosity and/or surface tension to resist excessive spreading or flowing off of active surface 32. As illustrated, the viscosity of adhesive material 35 may permit a quantity thereof to spread out somewhat when placed on active surface 32, while remaining relatively thick. By way of example only, adhesive material 35 may comprise an epoxy, a silicone, a silicone-carbon resin, a polyimide, or a polyurethane.

Figure 5:
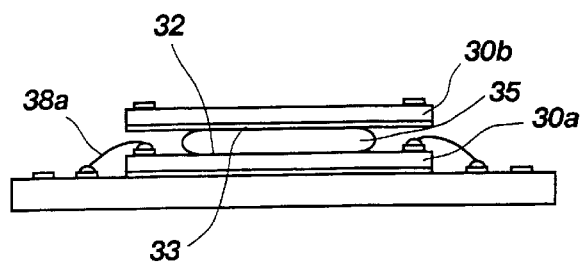

As depicted in FIG. 5, second semiconductor device 30b is aligned with and positioned over first semiconductor device 30a in substantially parallel planar relationship thereto and placed on adhesive material 35. The weight of second semiconductor device 30b, the force of a pick and place device that is used to align, position, and place second semiconductor device 30b, or a combination thereof may cause adhesive material 35 to be spread over active surface 32 of first semiconductor device 30a. Although discrete conductive elements 38a are depicted in FIG. 5 as not being encapsulated by adhesive material 35, assemblies including discrete conductive elements 38a that are at least partially encapsulated by adhesive material 35 and assemblies that include adhesive material 35 that substantially fills the gap between adjacent semiconductor devices 30a, 30b are also within the scope of the present invention.

Some suitable dielectric adhesive materials 35, such as those available from Dexter Corporation of Industry, Calif., as QUANTUM die attach and thermal adhesives, are thick (i.e., have high viscosities at room, or ambient, temperature) while becoming thinner (less viscous) upon being heated to temperatures that are less than their curing temperatures. Upon being subjected to increased temperatures, these adhesive materials 35 will draw second semiconductor device 30b toward first semiconductor device 30a. Upon reaching their cure temperatures, these materials will polymerize and cause first semiconductor device 30a and second semiconductor device 30b to be spaced apart from one another a distance that is substantially the same as a predetermined distance, such distance being predictable due to the nature of adhesive material 35.

Once first semiconductor device 30a and second semiconductor device 30b are substantially spaced a set distance apart from one another, which set distance may or may not be equal to the predetermined distance, depending upon whether or not adhesive material 35 expands or contracts upon curing, adhesive material 35 may be hardened or cured or permitted to harden or cure, as appropriate for the type of material used, to form second adhesive element 36. Of course, thermoplastic adhesive materials may harden upon cooling, while other types of adhesive materials 35 may be cured in a manner that depends upon the type of curable adhesive material 35 employed. By way of example only, snap curing processes, heat curing processes, UV curing processes, microwave curing processes, or any suitable combination thereof (e.g., UV curing an exposed, outer portion of adhesive material, then heat curing the interior portions thereof) may be used to cure a curable adhesive material 35 to at least a semisolid state.

Back side 33 of second semiconductor device 30b is electrically isolated from discrete conductive elements 38a that protrude above first semiconductor device 30a by being spaced apart therefrom, by dielectric coatings on at least contacting portions of one or both of discrete conductive elements 38a and back side 33, or by any combination of spacing and dielectric coatings.

Figure 6:
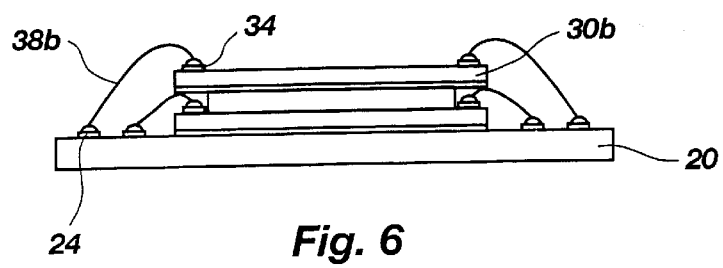

Next, as shown in FIG. 6, discrete conductive elements 38b may be positioned between bond pads 34 of second semiconductor device 30b and corresponding contact areas 24 of substrate 20 to electrically connect bond pads 34 and contact areas 24.

Figure 7:
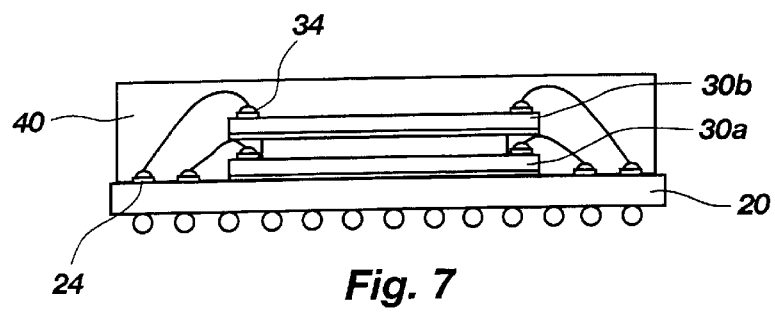
FIG. 7 is a schematic representation of a semiconductor device package including the assembly of FIG. 1.

Once bond pads 34 of second semiconductor device 30b are in communication with their corresponding contact areas 24 of substrate 20, a protective encapsulant 40 may be placed over all or part of substrate 20, first semiconductor device 30a, and/or second semiconductor device 30b, as shown in FIG. 7. By way of example only, protective encapsulant 40 may comprise a pot or transfer molded package, as shown in FIG. 7, a stereolithographically fabricated package, or a glob top type overcoat. Of course, known materials and processes may be used to form protective encapsulant 40. In the molded package example, protective encapsulant 40 may be formed from a transfer molding compound (i.e., a two-part silicon particle-filled epoxy) using known transfer molding processes, which may employ thermoset resins or thermoplastic polymers, or pot-molded using a thermosetting resin or an epoxy compound. In the stereolithography example, protective encapsulant 40 may comprise a plurality of at least partially superimposed, contiguous, mutually adhered material layers. For example, each layer may be formed by selectively curing (e.g., with a UV laser) regions of a layer of photocurable (e.g., UV curable) material, as known in the stereolithography art. When protective encapsulant 40 is a glob top, suitable glob top materials (e.g., epoxy, silicone, silicone-carbon resin, polyimide, polyurethane, etc.) may be dispensed, as known in the art, to form protective encapsulant 40.

Figure 8:
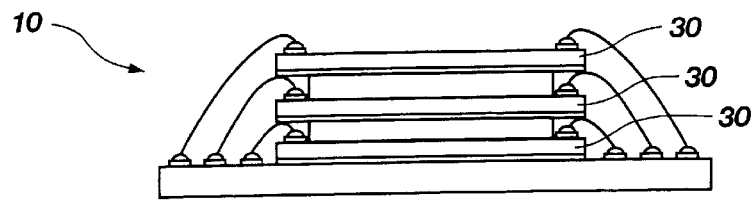
FIG. 8 schematically depicts an assembly of the embodiment depicted in FIG. 1 that includes an additional semiconductor device.

Optionally, as illustrated in FIG. 8, assembly 10 may include more than two semiconductor devices 30. Each additional semiconductor device may be added to assembly 10 in a manner similar to that described in reference to FIGS. 4–6.

Figure 9:
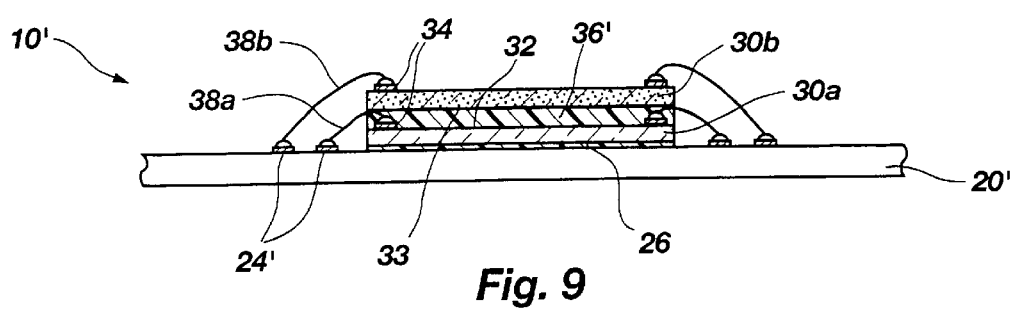
FIG. 9 is a schematic representation of another embodiment of an assembly according to the present invention.

Referring now to FIG. 9, another embodiment of an assembly 10' according to the present invention is depicted. Assembly 10' includes a substrate 20', in this case a circuit board, upon which a first semiconductor device 30a is positioned. First semiconductor device 30a may be secured to substrate 20' with a first adhesive element 26, such as a quantity of an appropriate thermoset resin, a quantity of pressure-sensitive adhesive, an adhesive-coated film or tape, or the like. Discrete conductive elements 38a, such as bond wires, TAB elements, or other thermocompression bonded leads, electrically connect bond pads 34 of semiconductor device 30a and corresponding contact areas 24', in this case terminals, of substrate 20', establishing communication between bond pads 34 and corresponding contact areas 24'.

A second semiconductor device 30b is positioned over first semiconductor device 30a, with a back side 33 of second semiconductor device 30b electrically isolated from underlying discrete conductive elements 38a. A second adhesive element 36' secures back side 33 of second semiconductor device 30b to an active surface 32 of first semiconductor device 30a, spacing first semiconductor device 30a and second semiconductor device 30b apart from one another a distance substantially the same as a predetermined distance. As depicted, second adhesive element 36' may substantially encapsulate portions of discrete conductive elements 38a located between first semiconductor device 30a and second semiconductor device 30b. By way of example, second adhesive element 36' may comprise an epoxy, a thermoset resin, a silicone, a polyimide, or a parylene, or any other material that, upon curing, will substantially maintain a selected distance between active surface 32 of first semiconductor device 30a and back side 33 of second semiconductor device 30b.

Discrete conductive elements 38b electrically connect bond pads 34 of second semiconductor device 30b and their corresponding contact areas 24' of substrate 20'. Again, bond wires, TAB elements, other thermocompression bonded leads, or the like may be used as discrete conductive elements 38b.

An exemplary method of fabricating assembly 10' is shown in FIGS. 10–15.

Figure 10:
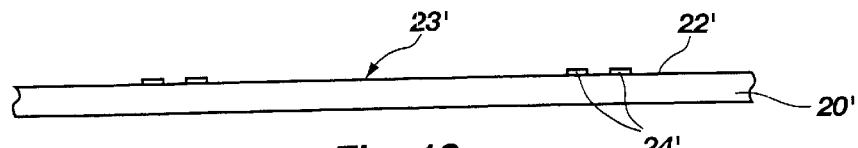
FIGS. 10–15 schematically depict fabrication of the assembly shown in FIG. 9.

In FIG. 10, a substrate 20' is provided. Substrate 20' includes a semiconductor device supporting region 23' on a surface 22' thereof and contact areas 24' exposed to surface 22' and positioned proximate to supporting region 23'. At least some of contact areas 24' correspond to bond pads 34 (FIG. 9) of a semiconductor device 30a, 30b to be positioned over substrate 20'.

Figure 11:
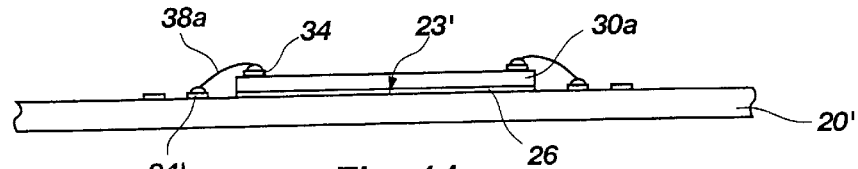

FIG. 11 shows a first semiconductor device 30a being positioned over supporting region 23' and secured thereto with a first adhesive element 26. In addition, FIG. 11 depicts the electrical connection of bond pads 34 of first semiconductor device 30a to corresponding contact areas 24' of substrate 20' by way of discrete conductive elements 38a.

Figure 12:
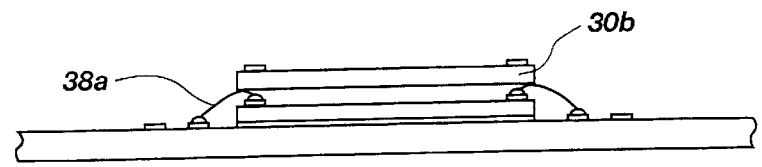

Second semiconductor device 30b is positioned on the uppermost portions of discrete conductive elements 38a, as shown in FIG. 12.

Figure 13:
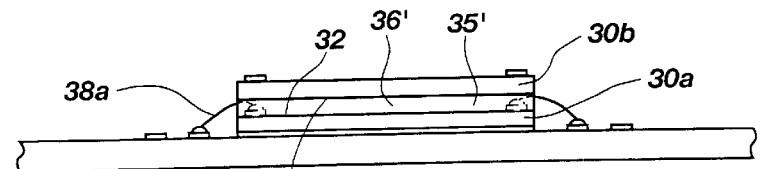
Figure 15:
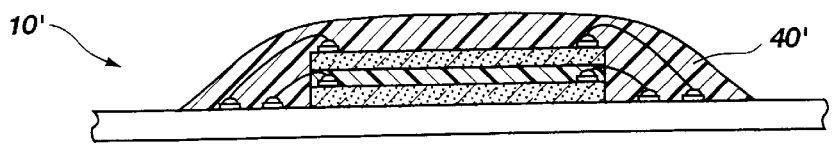

Referring now to FIG. 13, a volume substantially equal to a predetermined volume of at least partially unconsolidated (i.e., liquid, gel, etc.) adhesive material 35' may be introduced between active surface 32 of first semiconductor device 30a and back side 33 of second semiconductor device 30b. The viscosity of adhesive material 35' preferably facilitates the introduction of adhesive material 35' between active surface 32 and back side 33 without the formation of bubbles or other voids. As adhesive material 35' is introduced between and intended to adhere semiconductor devices 30a and 30b to one another, adhesive material 35' preferably adheres well to the materials of semiconductor devices 30a and 30b (e.g., silicon, glass, etc.). In addition, adhesive material 35' may have similar mechanical properties (e.g., modulus of elasticity, coefficient of thermal expansion, etc.) to materials that may subsequently be used to form a protective encapsulant 40 (FIG. 7) or 40' (FIG. 15). Further, if adhesive material 35' will at least partially encapsulate or otherwise contact discrete conductive elements 38a or any other conductive structures, it is preferred that it comprise a dielectric material. Known underfill materials (e.g., thermoset resins, two-stage epoxies, etc.) are examples of materials that are suitable for use as adhesive material 35'. Examples of such an adhesive material 35' include the liquid encapsulant material sold as WE707 by Kulicke & Soffa Industries of Willow Grove, Pa., and that sold by Dexter Corporation as QMI 536.

As adhesive material 35' is introduced between first semiconductor device 30a and second semiconductor device 30b, back side 33 of second semiconductor device 30b may be raised off of discrete conductive elements 38a, discrete conductive elements 38a or back side 33 may be at least partially coated with adhesive material 35', or a combination of these events may occur to electrically isolate discrete conductive elements 38a from back side 33. The distance between first semiconductor device 30a and second semiconductor device 30b may be substantially the same as the predetermined distance. Alternatively, if adhesive material 35' expands or shrinks upon curing, first semiconductor device 30a and second semiconductor device 30b may be spaced apart from one another by a different set distance. Then, upon curing of adhesive material 35', first semiconductor device 30a and second semiconductor device 30b will be spaced substantially the predetermined distance apart from one another. Upon hardening or curing, adhesive material 35' forms second adhesive element 36'.

Adhesive material 35' may be cured by an appropriate process or combination of processes, depending, of course, on the type of adhesive material 35' employed. By way of example only, snap curing processes, heat curing processes, UV curing processes, microwave curing processes, or any appropriate combination thereof may be used. When KNS or QMI536 are used as adhesive material 35', exposed edge portions thereof may first be partially or fully cured by photocuring processes (e.g., UV curing), then internal portions cured by way of a snap cure (e.g., KNS at a temperature of about 100° C. or higher) or thermal cure (e.g., QMI536 at a temperature of about 80° C. or higher).

Figure 14:
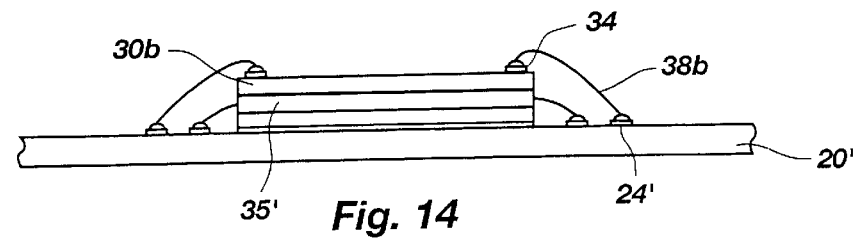

Once adhesive material 35' has sufficiently hardened or cured to at least a semisolid state, known processes may be employed to place discrete conductive elements 38b, such as bond wires, TAB elements, or other thermocompression bonded leads, between bond pads 34 of second semiconductor device 30b and corresponding contact areas 24' of substrate 20', as illustrated in FIG. 14.

As shown in FIG. 15, at least portions of assembly 10' maybe encapsulated, or packaged, as known in the art. By way of example, a protective encapsulant 40' may be formed by glob top encapsulation techniques employing suitable glob top encapsulant materials, as previously mentioned herein.

Figure 16:
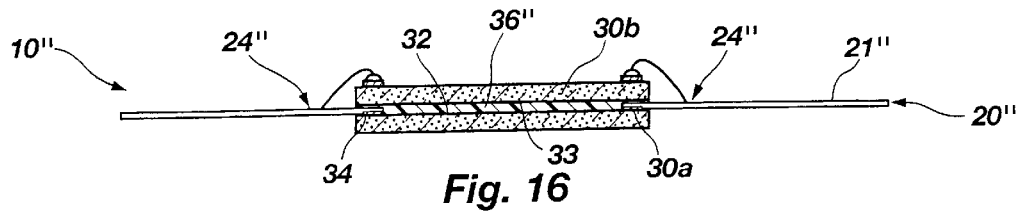
FIG. 16 is a cross-sectional representation of yet another embodiment of an assembly of the present invention.

Turning now to FIG. 16, another exemplary embodiment of assembly 10" of the present invention is illustrated. Assembly 10" includes a substrate 20", in the form of leads 21", and a first semiconductor device 30a with which leads 21" of substrate 20" are associated. Leads 21" may extend partially over an active surface 32 of first semiconductor device 30a into contact with bond pads 34 and be secured thereto (e.g., by way of thermocompression bonds, solder, etc.). Alternatively, leads 21" may extend to a location proximate bond pads 34 without contacting bond pads 34, in which case assembly 10" may also include discrete conductive elements (not shown), such as bond wires or TAB elements, that electrically connect contact areas 24" on leads 21" to corresponding bond pads 34.

Assembly 10" also includes a second semiconductor device 30b positioned upon portions of leads 21" in electrical isolation therefrom, as well as another adhesive element 36" positioned between an active surface 32 of first semiconductor device 30a and a back side 33 of second semiconductor device 30b. Adhesive element 36" is formed from a volume of adhesive material that is substantially equal to a predetermined volume and that spaces first semiconductor device 30a and second semiconductor device 30b apart from one another a distance substantially the same as a predetermined distance.

Alternatively, a first semiconductor device may rest upon a portion of a lead frame of which leads 21" are also a part. Discrete conductive elements may electrically connect bond pads of the first semiconductor device and a second semiconductor device in stacked relation thereto to corresponding contact areas of the leads.

Although the foregoing description contains many specifics, these should not be construed as limiting the scope of the present invention, but merely as providing illustrations of some exemplary embodiments. Similarly, other embodiments of the invention may be devised which do not depart from the spirit or scope of the present invention. Features from different embodiments may be employed in combination. The scope of the invention is, therefore, indicated and limited only by the appended claims and their legal equivalents, rather than by the foregoing description. All additions, deletions, and modifications to the invention, as disclosed herein, which fall within the meaning and scope of the claims are to be embraced thereby.

What is claimed:

1. A method for forming an assembly including semiconductor devices in stacked arrangement, comprising:

providing at least a first semiconductor device including discrete conductive elements extending partially over an active surface thereof;

positioning a second semiconductor device over said first semiconductor device and at least partially over at least one of said discrete conductive elements;

applying substantially a predetermined volume of adhesive material at least to said active surface of at least said first semiconductor device to space said active surface of at least said first semiconductor device apart from a back side of said second semiconductor device by substantially a predetermined distance.

2. The method of claim 1, wherein said positioning comprises placing said second semiconductor device on said discrete conductive elements.

3. The method of claim 2, wherein said applying comprises introducing said adhesive material between at least said first semiconductor device and said second semiconductor device.

4. The method of claim 3, wherein said introducing includes forcing said back side of said second semiconductor device away from at least said first semiconductor device and spacing said back side apart from said discrete conductive elements.

5. The method of claim 3, wherein said introducing includes substantially encapsulating portions of said discrete conductive elements located over said active surface of at least said first semiconductor device.

6. The method of claim 1, further comprising:
substantially hardening said adhesive material to at least a semisolid state to space said active surface of at least said first semiconductor device apart from said back side of said second semiconductor device substantially by said predetermined distance.

7. The method of claim 6, wherein said substantially hardening comprises substantially curing said adhesive material.

8. The method of claim 6, wherein said substantially hardening includes decreasing a distance said active surface of at least said first semiconductor device is spaced apart from said back side of said second semiconductor device from substantially a set distance to substantially said predetermined distance.

9. The method of claim 3, further comprising:
substantially hardening said adhesive material to at least a semisolid state to space said active surface of at least said first semiconductor device substantially said predetermined distance apart from said back side of said second semiconductor device.

10. The method of claim 9, wherein said substantially hardening comprises substantially curing said adhesive material.

11. The method of claim 9, wherein said substantially hardening includes decreasing a distance said active surface of said first semiconductor device is spaced apart from said back side of said second semiconductor device from substantially a set distance to substantially said predetermined distance.

12. The method of claim 1, wherein said applying comprises applying said adhesive material to said active surface of at least said first semiconductor device before said positioning.

13. The method of claim 12, further comprising, upon said positioning, using said adhesive material to draw said second semiconductor device toward at least said first semiconductor device until at least said first semiconductor device and said second semiconductor device are spaced substantially a set distance apart from one another.

14. A method for forming a multi-chip module, comprising:
providing a substrate including a plurality of contact areas;
establishing electrical communication between said substrate and a first semiconductor device;
placing a second semiconductor device over said first semiconductor device and at least partially over at least one discrete conductive element protruding above an active surface of said first semiconductor device; and
introducing substantially a predetermined volume of adhesive material onto at least an active surface of said first semiconductor device to space said active surface of said first semiconductor device substantially a predetermined distance apart from a back side of said second semiconductor device.

15. The method of claim 14, wherein said providing said substrate comprises providing at least one of a circuit board, an interposer, another semiconductor device, and leads.

16. The method of claim 14, wherein said establishing electrical communication comprises:
placing discrete conductive elements between bond pads of said first semiconductor device and corresponding contact areas of said substrate to electrically connect said bond pads to said corresponding contact areas, said discrete conductive elements extending partially over an active surface of said first semiconductor device.

17. The method of claim 16, wherein said placing discrete conductive elements comprises at least one of wire bonding pads to corresponding contact areas, tape-automated bonding bond pads to corresponding contact areas, and thermocompression bonding leads to bond pads.

18. The method of claim 16, wherein said introducing coats at least portions of discrete conductive elements located adjacent to said back side of said second semiconductor device.

19. The method of claim 14, further comprising:
substantially hardening said adhesive material to at least a semisolid state to space said active surface of said first semiconductor device apart from said back side of said second semiconductor device by substantially said predetermined distance.

20. The method of claim 19, wherein said substantially hardening comprises substantially curing said adhesive material.

21. The method of claim 19, further comprising;
decreasing a distance said active surface of said first semiconductor device is spaced apart from said back side of said second semiconductor device from substantially a set distance to substantially said predetermined distance by said substantially hardening.

22. The method of claim 16, further comprising:
encapsulating at least portions of said first semiconductor device, said second semiconductor device, said discrete conductive elements, and said substrate.

23. The method of claim 22, wherein said encapsulating comprises employing a glob top encapsulant.

24. The method of claim 22, wherein said encapsulating comprises transfer molding.

25. The method of claim 22, wherein said encapsulating comprises forming a plurality of at least partially superimposed, contiguous, mutually adhered material layers.

26. The method of claim 14, wherein said placing said second semiconductor device comprises placing said second semiconductor device onto said predetermined volume of adhesive material.

27. The method of claim 26, further comprising using said predetermined volume of adhesive material to draw said second semiconductor device toward said first semiconductor device with said second semiconductor device spaced substantially a set distance apart from said first semiconductor device.

28. The method of claim 14, wherein said introducing substantially said predetermined volume of adhesive material is effected following placement of said second semiconductor device.

29. The method of claim 28, wherein said introducing substantially said predetermined volume of adhesive material comprises introducing adhesive material between said first semiconductor device and said second semiconductor device.

30. The method of claim 29, wherein said introducing electrically isolates discrete conductive elements protruding from said first semiconductor device from said back side of said second semiconductor device.

31. The method of claim 29, wherein said introducing pushes said second semiconductor device away from said first semiconductor device to substantially said predetermined distance.

* * * * *

UNITED STATES PATENT AND TRADEMARK OFFICE
CERTIFICATE OF CORRECTION

PATENT NO. : 6,569,709 B2
DATED : May 27, 2003
INVENTOR(S) : James M. Derderian

It is certified that error appears in the above-identified patent and that said Letters Patent is hereby corrected as shown below:

<u>Column 5,</u>
Line 38, change "die" to -- device --.
Line 40, change "dice," to -- devices, --.

<u>Column 11,</u>
Line 53, change "maybe" to -- may be --.

Signed and Sealed this

Eleventh Day of April, 2006

JON W. DUDAS
*Director of the United States Patent and Trademark Office*